United States Patent [19]

Schillhof et al.

[11] Patent Number: 4,726,034
[45] Date of Patent: Feb. 16, 1988

[54] CIRCUIT ARRANGEMENT FOR THE TRANSMISSION OF BINARY SIGNALS

[75] Inventors: Udo F. Schillhof, Itzstedt; Winfried F. Hesse, Schenefeld, both of Fed. Rep. of Germany

[73] Assignee: U.S. Philips Corporation, New York, N.Y.

[21] Appl. No.: 765,031

[22] Filed: Aug. 12, 1985

[30] Foreign Application Priority Data

Aug. 16, 1984 [DE] Fed. Rep. of Germany ....... 3429982

[51] Int. Cl.[4] ............................................ H04L 25/20
[52] U.S. Cl. ...................................... 375/3; 178/71 R; 375/36
[58] Field of Search ............... 375/4, 36, 3; 178/70 R, 178/70 TS, 71 R, 71 N; 330/151, 193, 290, 291, 293, 250, 263; 307/268, 270, 260, 443; 370/29, 31

[56] References Cited

U.S. PATENT DOCUMENTS 3,600,696  8/1971  Grandmont ........................ 330/151
3,718,780  2/1973  Oya et al. ......................... 178/70 TS
3,851,098  11/1974  Pingault ................................. 375/36
4,238,737  12/1980  Yokoyama ........................... 330/269
4,300,018  10/1981  Rademaker ........................ 178/70 R Primary Examiner—Benedict V. Safourek
Attorney, Agent, or Firm—Thomas A. Briody; Jack E. Haken; Anne E. Barschall

[57] ABSTRACT

For the extension of busses use is made of special bus driver and receiver circuits which are capable of charging or discharging the higher capacitances of longer bus lines more quickly. However, in such circuit arrangements the direction is reversed by means of special control signals so that data transmission always takes place always in only one direction; or in other known circuits the reversal is liable to give rise to interference signals. In accordance with the invention, each bus of a local sub-system is connected to the control input of a transistor, notably a PNP-transistor whose collector is connected to 0 V and whose emitter is connected to the extended bus and, via a resistor, to +U. Moreover, between the emitter and the base there is connected a resistor which represents the pull-up resistor for the signals produced on the bus, the signals arriving via the extended bus are coupled onto the bus of the sub-system via this resistor. Unproblematic reversal of the transmission direction is thus possible.

12 Claims, 4 Drawing Figures

CIRCUIT ARRANGEMENT FOR THE TRANSMISSION OF BINARY SIGNALS

BACKGROUND OF THE INVENTION

The invention relates to a circuit arrangement for the bidirectional transmission of binary signals. The circuit arrangement is connected between a line, and a bus. The line is connected to one pole of a voltage source via at least a first resistor. The bus is connected to at least one data transmitter which is low-ohmic for only one binary signal value. The bus is also connected to at least one data receiver which has a comparatively high input resistance.

A circuit arrangement of this kind is used for connecting a sub-system, via said line to a corresponding subsystem. The former subsystem is formed from a plurality of individual arrangements which are situated near one another in space and which are connected by a short bus. The latter subsystem, however, is situated in a remote location with respect to the former subsystem and may also comprise a bus when the latter sub-system includes more than just one data transmitter and one data receiver. Each bus is also connected, via a resistor, to the one pole of the voltage source. A data transmitter customarily consists of a transistor which is connected between the bus and the other pole of the voltage source. The transistor connects the bus to the other pole of the voltage source, customarily the 0 volt potential of the overall system, for the one binary value of the data to be transmitted. Subsequently, the transistor in the data transmitter is turned off and the potential on the bus line again assumes the voltage value of the one pole of the voltage source, which is customarily +5 volts.

In high-frequency data transmission, the capacitance of the bus with respect to the environment gives rise to a problem. That is, for a signal transition to 0 volts the capacitance of the bus can be comparatively quickly discharged by the turned-on transistor in the data transmitter. However, when the transistor is turned off, the signal on the bus increases according to the time constant of the capacitance represented by the bus and the resistor connected to the +5 volts. The value of this resistor is limited by the current loadability of the transistors in the data transmitters, because they are generally included in integrated circuits so that only a limited crystal surface area is available and the loss of power may not become excessively high. Therefore, for a predetermined transmission speed or data rate the length of the bus is limited. An improvement can be achieved by replacing the resistor, which connects the bus to the one pole of the voltage source, by a current generator. However, this solution offers only minor improvement and is relatively expensive.

Therefore, for high-speed transmission of binary data via a bidirectional connection, the described circuit issued. The circuit is marketed, for example, as an integrated circuit of the type SN 74 LS 243. For a bus, such an integrated circuit comprises: an output amplifier which applies the signal present on the bus to a longer connection line in a low-ohmic manner; as well as an input amplifier which applies the signal from the connection line to the bus. For reasons of stability and current consumption, only one of the amplifiers is activated by means of control signals. The relevant control signals must ensure that it is impossible for the two amplifiers to be activated simultaneously. For easier operation of such transmitter/receiver circuits, for example integrated circuits of the type SN 74 LS 245, comprise internal combinatory logic elements to ensure that only one signal direction is enabled. In any case, however, the relevant control signals must be present for reversing the signal direction. A circuit arrangement in which the transmission direction is automatically reversed without control signals or by means of given constant control signals is known. An example is an integrated circuit of the type 8X41. This known circuit, however, is very complex and enables reversal of the transmission direction only when both the bus and the connection line carry a high potential.

SUMMARY OF INVENTION

It is the object of the invention to provide a circuit arrangement of the kind set forth which enables the transmission of data in both directions by simple circuitry without using additional control signals and without giving rise to stability problems, that is to say for both values of the transmitted signals.

This object is achieved in accordance with the invention in that there is provided a transistor, one main terminal of which is connected to the line and, via a second resistor, to the control terminal of the transistor. The control terminal is connected to the bus. The other main terminal of the transistor is connected to the other pole of the voltage source.

Without using control signals, the circuit in accordance with the invention enables the transmission of data in both directions. In particular, when the potential on the bus is decreased to a low value by a data transmitter and this low potential is applied to the line, a low potential which is impressed on the line from another location is transferred to the bus when the transistor in the data transmitter is turned off again. Thus, the arrangement in accordance with the invention offers an unproblematic extension of the bus which requires only very simple circuitry.

A particularly attractive embodiment is obtained when the transistor is a bipolar PNP transistor and when the first resistor is placed in the immediate vicinity of the transistor. A bipolar transistor is comparatively inexpensive for higher currents and does not give rise to potential shift problems between the line and the bus. Another attractive embodiment is obtained when the transistor is a P-channel field-effect transistor and the first resistor is placed in teh immediate vicinity of the transistor.

The resistance of the first resistor can be selected according to several parameters, for example according to the maximum lodability of the transistor. The value of the first resistor preferably corresponds to the characteristic impedance of the line, whilst the value of the second resistor amounts to at least ten times this characteristic impedance. Thus, reflections on the line reflections are avoided. Reflections could be particularly disturbing notably in long lines. However, each transistor must be capable of the delivering an amount of current required by the first resistors of other, corresponding circuit arrangements connected to all input points of the line. The resistance of the second resistor, connected to the one pole of the voltage source for the bus, can be selected in accordance with the desired data transmission speed and the available capacity of the bus.

Another possibility is to select the value of the first resistor in accordance with the output loadability of the bus and the current amplification of the transistor. Because the data transmitter connected to the bus can often supply only limited currents, while transistors having a high switching speed do not offer a high current amplification, the maximum value of the first resistor may thus be restricted.

BRIEF DESCRIPTION OF THE DRAWINGS

Embodiments in accordance with the invention will be described in detail in hereinafter with reference to the accompanying diagrammatic drawing. Therein.

DESCRIPTION OF THE PREFERRED EMBODIMENT

1. Further Discussion of Prior Art

Figure 1:
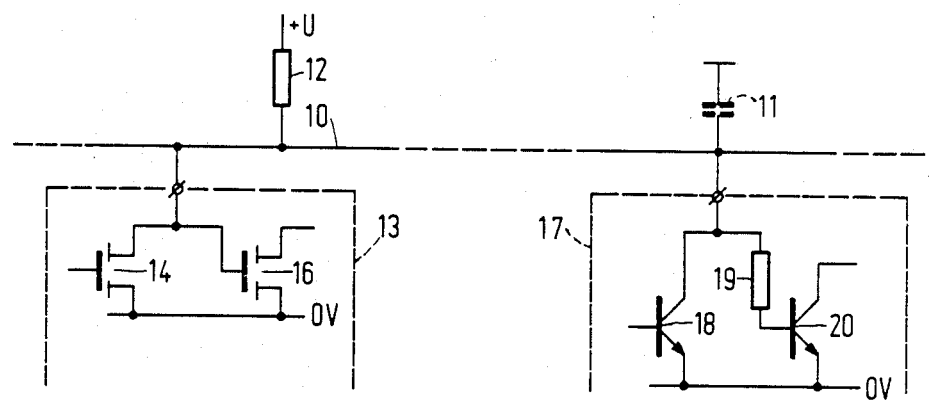
FIG. 1 shows a customary bus with a plurality of data transmitters and receivers.

FIG. 1 shows a bus 10 which is connected, via a resistor 12, to a pole +U of a voltage source (not shown). The bus 10 is also connected, via a connection terminal, to an integrated circuit 13; only the transistor 14 of the data transmitter and the transistor 16 of the data receiver thereof are shown. These transistors are field effect transistors whose source is connected to the reference potential 0 V, while the bus 10 is connected to the drain of the transmission transistor 14 and to the gate of the transistor 16. The bus 10 is also connected to a further integrated circuit 17 which is constructed according to the bipolar technique; only the transistor 18 of the data transmitter and the transistor 20 of the data receiver thereof are shown. The emitters of both transistors are again connected to the reference potential 0 V, the bus 10 being connected to the collector of the transistor 18 and, via a resistor 19, to the base of the transistor 20.

When data is to be transferred from the integrated circuit 13 to the circuit 17, the gate of the transistor 14 is driven so that the transistor is turned on and the potential on the bus 10 becomes substantially 0 V. It is assumed that the transistor 18 is meanwhile turned off, so that no current flows therein. The low potential reaches the base of the transistor 20 which is thus turned off, so that the current to its collector which is connected to the signal processing parts of the integrated circuit is interrupted. When the transistor 14 is subsequently turned off again, the potential on the bus becomes +U again in accordance with the time constant of the value of the resistor 12 and the capacitance of the bus with respect to the environment which is in this case symbolically represented by a capacitor 11. In the case of short busses 10, this capacitance 11 has a small value so that the positive-going edge of the signal on the bus 10 is comparatively short. However, when a long bus 10 is required in view of space requirements, the value of the capacitance 11 increases and the positive going edge of the signal on the bus 10 becomes very long, thus limiting the maximum data transmission speed via the bus 10. In many cases it is not readily possible to reduce the value of the resistor 12, because the transistors 14 and 18 and possible further integrated circuits connected to the bus 10 can drive only comparatively small currents.

Figure 2:
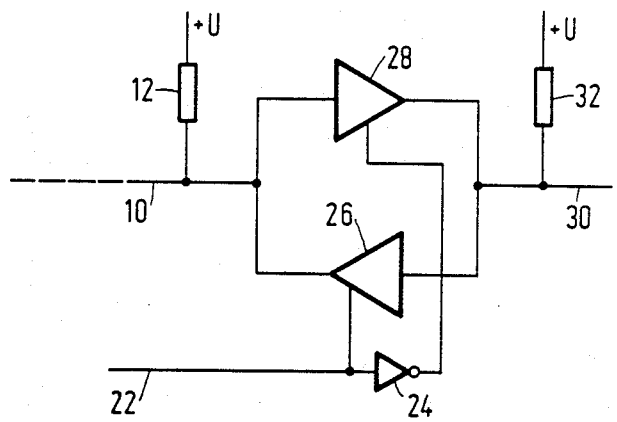
FIG. 2 shows a known circuit arrangement for extending a data bus with a reversible transmission direction.

A number of integrated circuits often form a sub-system whose individual elements are situated in the immediate vicinity of one another and are interconnected via a comparatively short bus 10. A plurality of such busses 10 can then also be used for different data signals and control signals. Such a sub-system is to be connected to another sub-system which is situated in a remote location. For this purpose it is known to use bus drivers and receivers, for example of the type SN 74 LS 245, which comprise two amplifiers 26 and 28 for each bus, the bus 10 being connected to the input of the amplifier 28 and the output of the amplifier 26 as shown in FIG. 2. These amplifiers are switchable, i.e. they can interrupt the signal connection between the input and the output by means of a control signal which is supplied via line 22. In the presence of one value of the control signal on the line 22, for example the amplifier 26 is active while the amplifier 28 is blocked via the inverter 24, so that a low potential is applied from the line 30, connected to the input of the amplifier 26 and the output of the amplifier 28, to the bus 10. In the presence of the other signal value on the line 22, the amplifier 26 is blocked and the amplifier 28 is active, so that a signal value present on the bus 10 is applied to the line 30. Arrangements such as the transistors 14 and 18 in FIG. 1 are connected, for example to the output of the amplifiers 26 and 28, so that in addition to the bus 10, the line 30 leading to a remote subsystem is also connected, via a resistor 32, to the one pole +U of a voltage source. However, this known circuit arrangement does not enable automatic switching over from the transmitter function to the receiver function. For example, first a low signal may be formed on the bus 10 in order to be applied, via the line 30, to the remote system. The remote system immediately responds by way of a low potential. In this way the bus 10 remains low even though the data transmitter connected thereto has meanwhile become high-ohmic again, because the signal on the line 22 should be switched over at the correct instant. However, the correct instant is not easily known in the sub-system connected to the bus 10.

2. The Present Invention

Figures 3, 4:
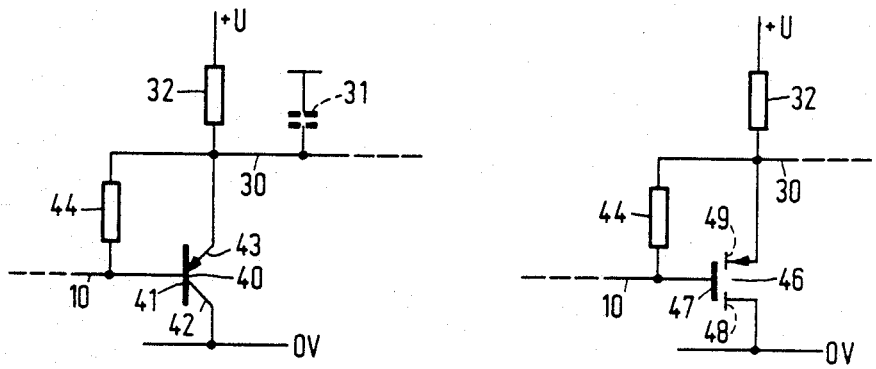
FIG. 3 shows a circuit arrangement in accordance with the invention which comprises a bipolar transistor.
FIG. 4 shows a circuit arrangement in accordance with the invention which comprises a field effect transistor.

Therefore the bus 10 in the circuit arrangement shown in FIG. 3 is connected to the base 41 of a PNP transistor 40, the collector of which is connected to the reference potential 0 V. Via a resistor 44, the bus 10 is also connected to the emitter 43 of the transistor 40. This resistor 44 replaces the resistor 12 in the FIGS. 1 and 2 which is directly connected to the one pole +U of the voltage source. The emitter 43 of the transistor 40 is also connected to the line 30 which is connected, via the resistor 32, to the one pole +U of the voltage source.

When a transistor in a data transmitter connected to the bus 10 is turned on, the potential on the bus 10 becomes substantially 0 V. Consequently, the potential on the line 30 also decreases, that is to say to a value $U_{BE}$, i.e. more positive than the reference voltage 0 V by the amount of the base emitter voltage of the transistor 40. The current in the transistor of the data transmitter connected to the bus 10 then flows partly via the resistor 44 and for the remainder via the base 41 of the transistor 40, so that in the emitter 43 thereof a substantially larger current can flow in comparison with the bus 10, so that the resistor 32 may have a comparatively small value. When the transistor in the data transmitter connected to the bus 10 is turned off again, the comparatively low capacitance of the bus 10 is charged via the resistor 44 which, therefore, may be comparatively large. The capacitance 31 of the line 30, however, is charged via the resistor 32 which has a comparatively small value, so that a comparatively steep positive going edge is achieved also on the line 30. The value of the resistor 32 can now be chosen in accordance with the current amplification of the transistor 40 and the maximum permissible current on the bus 10; it must be taken into account that several of the arrangements shown in FIG. 3 may be connected in parallel to the bus 10, the respective series combinations of resistors 32, 44 of each arrangement thereof then being connected in parallel. However, when the line 30 has a defined characteristic impedance which is higher than the minimum permissible value of the resistor 32, resulting from the current amplification of the transistor 40 and the permissible current on the bus 10, the value of the resistor 32 can also be chosen so as to be equal to the characteristic impedance. However, when the line 30 is only short so that it represents a small capacitive load, the value of the resistor 32 may alternatively be chosen to be higher in order to reduce the current consumption of the complete system. The value of the resistor 44 should be small enough to enable fast charging of the bus 10, but should not be so small that the current amplification of the transistor 40 is excessively reduced.

When no turned on transistor of a data transmitter is connected to the bus 10 in the circuit arrangement shown in FIG. 3, but a low potential is applied, via the line 30, from another arrangement, notably an arrangement corresponding to that shown in FIG. 3, this potential is applied, via the resistor 44 and the bus 10, to the inputs of the data receivers connected thereto. Because the turned off transistors of the data transmitter as well as the inputs of the data receivers are comparatively high-ohmic, it is merely necessary to discharge the capacitance of the bus line 10 to the low potential of the line 30, via the resistor 44, so that a negative-going signal edge on the line 30 is quickly transferred to the bus 10. Thus, the arrangement shown in FIG. 3 is conductive for both signal directions without reversal of the signal direction being required.

The transistor in FIG. 4 is constructed as a P-channel field effect transistor 46. The drain 48 thereof is connected to the reference voltage 0 V, its source be 49 being connected to the line 40, the resistor 32 and the resistor 44, while its gate 47 is connected to the other end of the resistor 44 and the bus 10. The function of the circuit is exactly the same of that of the circuit shown in FIG. 3, it merely being necessary to select a suitable threshold voltage for the transistor 46 in order to ensure that the voltage difference between the potential on the bus 10 and the line 30 is suitable for reliable signal transmission.

What is claimed is:

1. A circuit arrangement for bidirectional transmission of binary signals comprising:
   (a) first and second terminals for coupling to a first pole via at least a first resistor and to a second pole, respectively, of a voltage source, said first terminal also being for coupling to a first bus which in turn is coupled to at least one first data transmitter and at least one first data receiver; and
   (b) a second resistor; and
   (c) a transistor including:
      (i) a first main electrode coupled to said first terminal;
      (ii) a control electrode, coupled to said first main electrode via said second resistor and for coupling to a second bus which is in turn coupled to at least one second data transmitter which has a low resistance only for one binary signal value and which has second bus is coupled to at least one second data receiver which has a comparatively high input resistance; and
      (iii) a second main electrode coupled to said second terminal, said first and second main electrodes defining a main current path through said transistor.

2. Apparatus for bidirectional transmission of binary signals between first and second data lines, said first line being for coupling with at least one first data transmitter and at least one first data receiver comprising
   (a) first and second terminals for coupling to first and second poles of a voltage source, respectively;
   (b) at least one first resistor coupling the first line to said first terminal;
   (c) said second line being for coupling to an output of at least one second data transmitter which has a low resistance only for one binary signal value and for coupling to an input of at least one second data receiver which has a comparatively high input resistance;
   (d) a second resistor; and
   (e) a transistor including:
      (i) a first main electrode coupled to said first line and via said first resistor to said first terminal;
      (ii) a control electrode, coupled to said first main terminal via said second resistor, and coupled to said second line; and
      (iii) a second main electrode coupled to said second terminal, said first and second main electrodes defining a main current path through said transistor.

3. The apparatus of claim 2 wherein said first line and said second line together form an extended bidirectional data line.

4. The apparatus of claim 2 wherein:
   (a) said transistor comprises a bipolar PNP transistor; and
   (b) said first resistor is arranged in an immediate vicinity of said transistor.

5. The apparatus of claim 4, wherein a resistance is chosen for said first resistor to effect a maximum permissible current on said second line and a given current amplification of said transistor.

6. The apparatus of claim 2 wherein a resistance is chosen for said first resistor to effect a maximum permissible current on said second line and a given current amplification of said transistor.

7. The apparatus of claim 2 wherein there is only one said transistor.

8. The apparatus of claim 2, wherein:
   (a) said transistor comprises a P-channel field effect transistor; and
   (b) said first resistor is arranged in an immediate vicinity of said transistor.

9. The apparatus of claim 1, 2, 3, 4, 7 or 8, wherein:
   (a) said first resistor has a resistance corresponding to the characteristic impedance of said first line; and
   (b) said second resistor has a resistance at least ten times said resistance of said first resistor.

10. The circuit arrangement of claim 2 wherein a resistance of the first resistor is chosen to be compatible with an output loadability of said second line and with a given current amplification of the transistor.

11. A bus system for bidirectional transmission of binary signals comprising:
   (a) a first line;
   (b) at least one first data transmitter which has a low resistance only for one binary signal, said transmitter having an output coupled to said first line;
   (c) at least one first data receiver which has a comparatively high input resistance, said receiver having an input coupled to said first line;
   (d) means for bidirectional transmission including:
      (i) first and second terminals for coupling to first and second poles, respectively, of a voltage source;
      (ii) at least one first resistor coupled to said first terminal;
      (iii) a second line coupled via said first resistor to said first terminal, said line being for coupled to at least one second data transmitter and at least one second data receiver;
      (iv) a second resistor;
      (v) a transistor including:
         (A) a first main electrode coupled to said second line and via said first resistor to said first terminal;
         (B) a control electrode coupled to said first main electrode via said second resistor, and coupled to said first line; and
         (C) a second main electrode coupled to said second terminal, said first and second main electrodes defining a main current path through said transistor.

12. The system of claim 11 wherein said first and second lines are first and second buses, whereby said first bus and said second bus together form an extended bidirectional bus.

* * * * *